(12) United States Patent
Lai et al.

(10) Patent No.: US 6,201,283 B1
(45) Date of Patent: Mar. 13, 2001

(54) FIELD EFFECT TRANSISTOR WITH DOUBLE SIDED AIRBRIDGE

(75) Inventors: Richard Lai, Redondo Beach; Yaochung Chen, Rancho Palos Verdes; Huan-Chun Yen; James C. K. Lau, both of Torrance, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/391,339

(22) Filed: Sep. 8, 1999

(51) Int. Cl.$^7$ .................................... H01L 29/76

(52) U.S. Cl. ........................ 257/410; 257/419; 257/433

(58) Field of Search .................... 257/410, 419, 257/433, 276, 355; 438/422, 319, 619, 280, 414

(56) References Cited

U.S. PATENT DOCUMENTS

| | | | | |
|---|---|---|---|---|
| 3,475,234 | * | 10/1969 | Kerwin | 257/410 |
| 5,019,877 | | 5/1991 | Hosogi . | |
| 5,247,201 | * | 9/1993 | Becker | 257/546 |

OTHER PUBLICATIONS

Ezio M. Bastida, "Airbridge Gate FET$^1$ for GaAs Monolithic Circuits", IEEE Transactions on Electron Devices, vol. Ed. 72, No. 12, Dec. 1985.

* cited by examiner

Primary Examiner—Olik Chaudhuri
Assistant Examiner—Nathan W. Ha
(74) Attorney, Agent, or Firm—Michael S. Yatsko; Robert W. Keller

(57) ABSTRACT

A field effect transistor with a double sided airbridge comprises a substrate containing a conductive region and source, drain and gate electrodes disposed on the substrate. The gate electrode has a finger portion with a first end secured to the substrate between the source and drain electrodes and a second end, and a double sided airbridge portion flaring outwardly from the second end and having opposed first and second extremities. A first gate pad is disposed on said substrate outwardly from the source electrode and is connected to the first extremity. A second gate pad is disposed on said substrate outwardly from the drain electrodes and is connected to the second extremity. The gate pads serve to support the airbridge gate finger so as to reduce stress on the gate finger. The first and second gate pads receive and transmit signals through the airbridge and to and from the gate finger.

11 Claims, 2 Drawing Sheets

FIELD EFFECT TRANSISTOR WITH DOUBLE SIDED AIRBRIDGE

BACKGROUND OF THE INVENTION

1. Field of the Invention

The present invention relates generally to field effect transistors, and more particularly to a field effect transistor with a double sided airbridge.

2. Description of the Prior Art

A conventional field effect transistor (hereinafter referred to as an FET) includes a semiconductor substrate (reference numeral 1 in FIGS. 1a and 1b) with conductive layers or insulating layers disposed on the substrate. A gate electrode is provided to modulate the current flowing through a channel from a drain electrode to a source electrode in response to a radio frequency (RF) electrical signal applied thereto. Most commonly, the gate is fed from the end with the RF modulating signal which travels the length of the gate stripe.

One use of such an FET is as a low noise amplifier. An example of an FET is shown in FIG. 1 and found in IEEE Transactions On Electron Devices, Vol. ED-31, No. 12, Dec. 1985, pgs. 2754–2759, "Airbridge Gate FET For GaAs Monolithic Circuits". In such article a single airbridge structure 6 is formed over the source electrode 4. The airbridge 6 is T-shaped in plan view and connects the relatively small gate pad 2b at the base of the T at one side of the source strip contact 4 and the narrow gate finger electrode 2a along its whole width at the top of the T. Electric power is supplied to the small stepped gate pad 2b in the FET with the current flowing through outwardly fanned paths to the much wider gate finger electrode 2a. However, the airbridge 6 and the source electrode 4 cross each other over a large area as shown in FIG. 1a. Thus, even though an airbridge structure is used, an increase in gate capacitance is created which decreases performance at high frequencies. More importantly, during fabrication of the single airbridge, a large stress is exerted on the extremely narrow gate finger 2a. This stress can be considered visually as a force vector angled upwards and to the right on the junction of the gate finger 2a and the substrate 1 as shown in FIG. 1b. Thus, this large force applied to the small gate finger junction area results in extreme stress exerted on the relatively small base portion of gate finger. This reaction reduces the relatively weak gate finger structural bond with the substrate so that the metal gate structure tends to lift off during fabrication of the FET. Also, the electrical resistance of the single airbridge gate is significant which decreases the cut-off frequency of the FET.

Another example of a field effect transistor is illustrated in FIG. 2, and found in U.S. Pat. No. 5,019,877, "Field Effect Transistor", by Kenji Hosogi. In such patent the field effect transistor with its substrate 1, drain electrode 3 and source electrode 4 includes a narrow airbridge wiring structure 6 that resembles a raised narrow elongated conductor which connects adjacent feeding points 5 on a gate finger 2a longitudinally along the width of the airbridge. Although the narrow airbridge with its narrow footprint reduces resistance and capacitance of the structure, such an FET, however, has a propagation time delay and a relatively high gate resistance.

What is needed, therefore, is an FET in which includes an airbridge portion of a gate electrode that reduces the structural stress on the relatively small central gate finger portion and which provides a lower gate resistance.

SUMMARY OF THE INVENTION

The preceding and other shortcomings of the prior art are addressed and overcome by the present invention which provides a field effect transistor comprising a substrate containing a conductive region, conductive source and drain electrodes disposed on the substrate on the conductive region, and a conductive gate electrode disposed on the substrate. The gate electrode includes a central narrow finger portion with a first end at the conductive region between the source and the drain electrodes and a second end. A double sided airbridge portion flares outwardly from the second end and resembles wings or the letter T in front view and is generally rectangular in plan view. A first gate pad is disposed on the substrate outwardly from the source electrode and is connected physically and electrically to, and along the width of, one extremity of the airbridge and a second gate pad is disposed on the substrate outwardly from the drain electrode and is physically and electrically connected to, and along the width of, the second extremity of the airbridge. Hence, FET the gate pads support the opposed outermost extremities of the winged airbridge which reduces the stress on the centrally positioned and relatively narrow gate finger, especially during fabrication. The airbridge serves to reduce the electrical gate resistance characteristic of the field effect of the FET with each end of the winged portions effectively providing parallel resistance paths. In operation the first and second gate pads receive and transmit signals to and from the gate finger portion to modulate current flowing from the source to the drain electrodes. The FET is generally used at microwave or millimeter wave frequencies.

The foregoing and additional features and advantages of this invention will become apparent from the detailed description and accompanying drawing figures below. In the figures and the written description, numerals indicate the various elements of the invention, like numerals referring to like elements through both the drawing figures and the written description.

BRIEF DESCRIPTION OF THE DRAWINGS

FIG. 1a is a plan view of a prior art FET employing a single T-shaped airbridge.

FIG. 1b is a cross section view taken through the lines Ia–Ib of the prior art FET of FIG. 1a.

FIG. 2b is a fragmentary perspective view of the prior art FET shown in FIG. 2a.

DETAILED DESCRIPTION OF THE PREFERRED EMBODIMENTS

Figure 1:
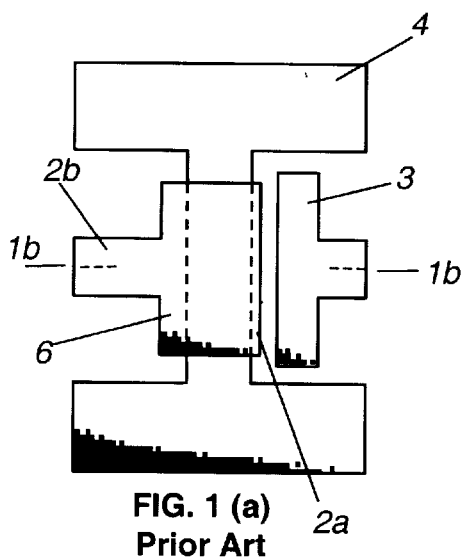
Figure 2A:
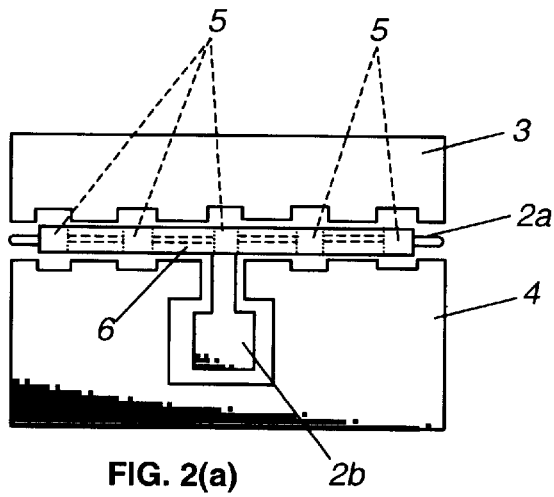
FIG. 2a is a plan view of a prior art FET employing a narrow longitudinal airbridge over the gate finger.
Figure 1B:
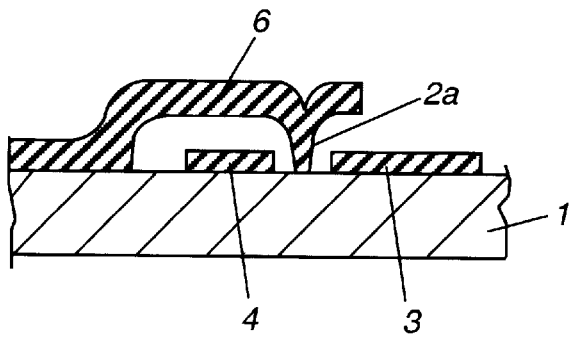
Figure 2B:
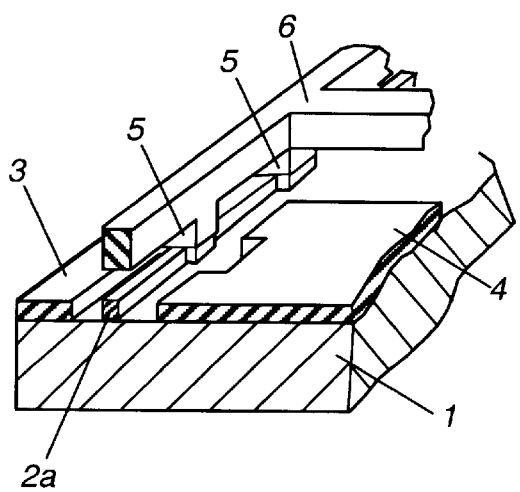
Figure 3:
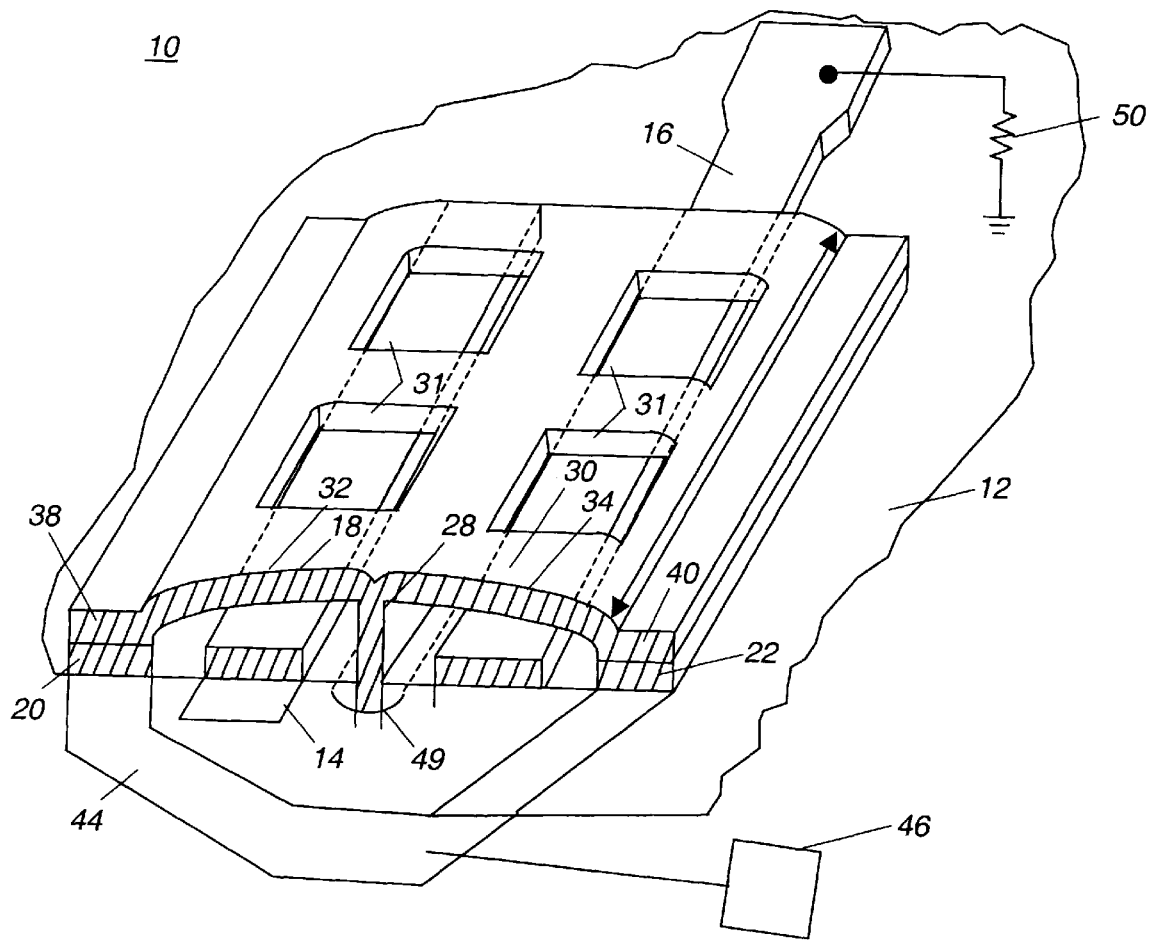
FIG. 3 is a perspective view of an FET with a double sided airbridge in accordance with the present invention.

As illustrated in FIG. 3, the present invention provides an FET, generally indicated by the numeral 10.

The FET 10 is formed by conventional semiconductor processing techniques and comprises a compound semiconductor substrate 12, such as gallium arsenide. A source electrode 14, a drain electrode 16, and a gate electrode 18, each being separated from the other, having an elongated shape and formed of a conductive material, are produced on the top surface of the substrate 12. Preferably, to reduce the parasitic inductance to ground, the source electrode 14 is grounded through via holes to a grounded back metal (not shown).

Gate pads 20 and 22 also are formed from a conductive material on the substrate 12. The elongated gate pads 20 and 22 are separated and laterally outward from, and substantially parallel to, the source 14 and the drain 16 electrodes and serve to receive and transmit signals to and from the gate electrode 18. The gate electrode 18 is an integral structure that includes a narrow gate finger portion 28 having a narrow length dimension and centrally disposed between the source 14 and the drain 16 and a double sided airbridge portion 30 that resembles a pair of wings 32 and 34, or a letter T with drooping ends in front view. The wings 32 and 34 extend over the source 14 and the drain 16 with its outer extremities 38 and 40, respectively, being disposed over the length of the gate pads. Thus, the source and drain electrodes are uniformly separated from the gate finger. The outer extremities 38 and 40 of the airbridge 30 are physically and electrically connected to and integral with the gate pads 20 and 22 along their entire length and width. As such the gate width is equal to the width of the airbridge. Preferably, the width of the airbridge, the finger portion and the gate pads are about 50 times the length of the gate pad and the outer extremities of the airbridge portion. Hence, the gate pads 20 and 22 support the opposed outermost extremities 38 and 40 of the airbridge 30 and reduce the stress on the junction of the relatively narrow gate finger 28 and the substrate 12. The air gap between the source and the drain electrodes and the airbridge involves negligible parasitic capacitance toward the source and the drain electrodes. Electrically, the airbridge 30 appears as two parallel resistors from the respective extremities to the gate finger. This parallel resistance configuration reduces the overall gate resistance by two. The thickness of the airbridge portion is substantially uniform throughout and generally equal to the thickness of the gate pads. A conductive gate feed 44 having a general V-shape in plan view is disposed on the substrate 12 and electrically connects an electrical signal source 46 to the gate pads 20 and 22. This supplies signals to the FET to modulate the current flow in the channel 49 in the substrate between the source 14 and the drain 16 electrodes. The conductive structure with the electrically connected gate pads and airbridge results in the entire width of the gate finger 28 being excited at substantially the same time since the input signals applied to the gate pads propagate across the entire airbridge span, terminating at the gate finger 28 at essentially the same time. In this regard it should be recognized that the new gate feed has minimum transmission line loss compared to the line loss of the conventional end fed gates.

In operation the gate feed conductors 44 apply an RF signal to the gate pads 20 and 22. The signal is conducted through the outer extremities 38 and 40 of the airbridge 30 inwardly toward the central gate finger portion 28 and propagated downstream along the width of the airbridge. Because of the rectangular plan view geometry of the airbridge, substantially the entire gate finger 28 is excited at the same time. As described, preferably the source electrode is grounded to reduce parasitic inductance. The current supplied to the gate finger 28 is amplified through the channel to the drain electrode 16 to produce the drain current at the output of the FET. The drain current flowing through a load impedance 50 creates the output voltage of the FET.

The present invention replaces a conventional FET gate structure with a double sided airbridge gate structure that contacts the entire width of the elongated gate finger. The double airbridge gate structure has a very low loss because it is much wider than the gate in a conventional FET. The structure enables the entire gate finger to be excited at the same time as the input signal propagates down the width of the airbridge span that terminates at the gate. This results in a highly desired coherent, high-gain, high efficiency amplification.

Depending on the operating frequency of the FET the gate length of the finger is between 0.05 $\mu$m and 10 $\mu$m, the separation between the gate finger and the source and the drain electrodes, respectively, is between 0.1 $\mu$m and 10 $\mu$m, the thickness of the gate pad metal and the airbridge metal is between 0.2 $\mu$m and 10 $\mu$m, and the width of the airbridge and the width of the gate finger are between 3 $\mu$m and 500 $\mu$m. Hence, the width of the airbridge may be about 500 times the length of a gate pad so as to firmly support the gate finger and reduce gate resistance.

In the above-illustrated embodiment a high electron mobility transistor (HEMT) is described, but the present invention is not restricted thereto and may be applied to all control electrode structures of a field effect transistor which includes FET, HFET, MESFET, TEGFET, and MODFET devices, and any binary ternary and quaternary components which are used to built the FET devices using the elements silicon (Si), germanium (Ge), gallium (Ga), arsenic (As), aluminum (Al), indium (In), antimonide (Sb), phosphorus (P), Nitrogen (N) and carbon (C) (and many metals as are used for constructing the gate), such as a GaAs MESFET operating at high frequencies. The FETs can be operable from DC to 1 Hz.

Obviously, many modifications and variations of the present invention are possible in light of the above teachings. Thus, it is to be understood that, within the scope of the appended claims, the invention may be practices otherwise than as specifically described above.

What is claimed is:

1. A field effect transistor comprising:

a substrate;

source and drain electrodes disposed on said substrate;

a gate electrode having a finger portion with a first end secured to said substrate between said source and drain electrodes and a second end, and a double sided airbridge portion flaring outwardly from said second end and having a first and a second extremity;

a first gate pad disposed on said substrate outwardly from said source electrode and being joined to said first extremity of said airbridge portion; and a second gate pad disposed on said substrate outwardly from said drain electrode and being joined to said second extremity of said airbridge portion, said first and said second gate pads for receiving and transmitting signals through the airbridge and to and from said gate finger portion.

2. The field effect transistor as set forth in claim 1, wherein said gate pads are physically and electrically connected to said outermost extremities.

3. The field effect transistor as set forth in claim 1, wherein said gate pads and said double sided airbridge portion have substantially identical widths.

4. The field effect transistor as set forth in claim 3, and further comprising means for feeding a signal to said first and said second gate pads such that it is conducted to said airbridge portion and inwardly therethrough to said gate finger portion and it propagates along the width of said airbridge portion.

5. The field effect transistor as set forth in claim 4, wherein said airbridge portion serves to propagate a feed signal through its width in a manner similar to a transmission line.

6. The field effect transistor as set forth in claim 1, wherein said first and said second gate pads are substantially equidistant from said drain electrode and said source electrode, respectively.

7. The field effect transistor as set forth in claim 1 wherein said gate finger portion is centrally disposed relative to said first and said second gate pads.

8. The field effect transistor as set forth in claim 1, wherein the thickness of said gate pads is substantially equal to the thickness of said airbridge portion.

9. The field effect transistor as set forth in claim 1, wherein said gate pads support said outermost extremities so as to reduce the stress on said gate finger portion.

10. The field effect transistor as set forth in claim 1, wherein said airbridge portion serves to reduce the electrical gate resistance characteristic of the field effect transistor.

11. The field effect transistor as set forth in claim 1, wherein the source and drain electrodes and conductive region are configured as a high mobility electron transistor.

\* \* \* \* \*